United States Patent [19]

Wilson

[11] 4,028,557
[45] June 7, 1977

[54] DYNAMIC SENSE-REFRESH DETECTOR AMPLIFIER

[75] Inventor: Dennis Robert Wilson, Allentown, Pa.

[73] Assignee: Bell Telephone Laboratories, Incorporated, Murray Hill, N.J.

[22] Filed: May 21, 1976

[21] Appl. No.: 688,586

[52] U.S. Cl. .................. 307/362; 307/238; 307/279; 307/DIG. 3; 307/DIG. 4; 340/173 CA; 340/173 DR
[51] Int. Cl.² .................. H03K 5/20; H03K 3/286; H03K 3/353; G11C 7/06
[58] Field of Search .......... 307/235 F, 235 T, 238, 307/246, 279, 291, DIG. 3, DIG. 4, 251; 340/173 R, 173 CA, 173 DR

[56] References Cited
UNITED STATES PATENTS

| | | | |
|---|---|---|---|
| 3,678,473 | 7/1972 | Wahlstrom | 307/238 X |
| 3,760,381 | 9/1973 | Yao | 307/DIG. 3 X |
| 3,806,898 | 4/1974 | Askin | 307/238 X |
| 3,949,381 | 4/1976 | Dennard et al. | 307/DIG. 3 X |
| 3,976,895 | 8/1976 | Koo | 307/DIG. 3 X |
| 3,978,459 | 8/1976 | Koo | 340/173 R |
| 3,979,603 | 9/1976 | Gosney | 307/DIG. 3 X |
| 3,986,172 | 10/1976 | Elmer et al. | 307/DIG. 3 X |

Primary Examiner—John S. Heyman
Assistant Examiner—Larry N. Anagnos
Attorney, Agent, or Firm—Irwin Ostroff

[57] ABSTRACT

A dynamic sense-refresh detector amplifier consists essentially of a cross coupled MOS transistor pair and two sets of load-refresh circuits which each include a capacitor and three MOS transistors. The load-refresh circuits eliminate the negative effect of threshold voltage losses on noise margin by allowing the memory cells from which information is read out and sensed to be refreshed to full 1 and 0 levels. The dynamic operation of the amplifier allows for relatively low power dissipation.

5 Claims, 2 Drawing Figures

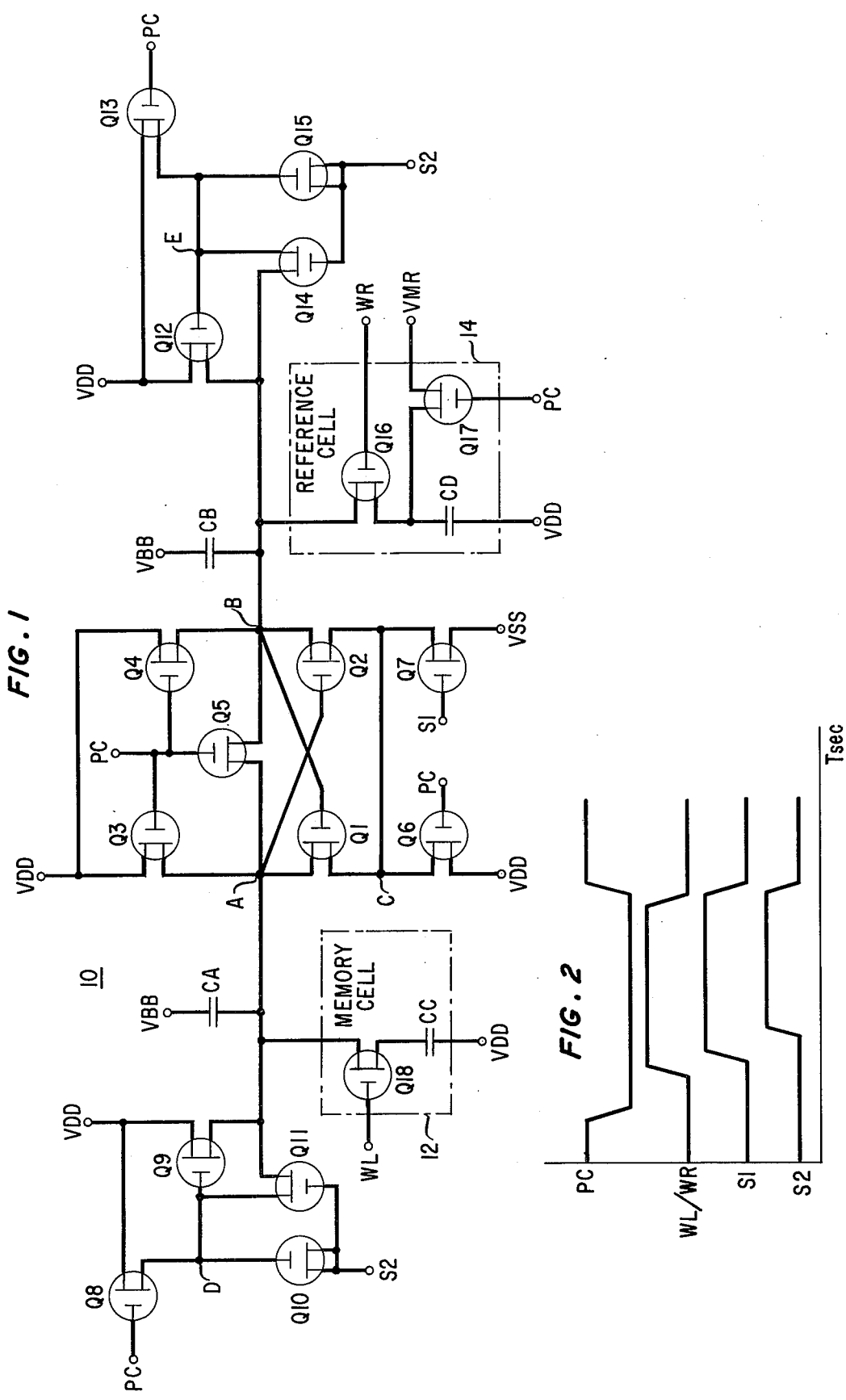

DYNAMIC SENSE-REFRESH DETECTOR AMPLIFIER

BACKGROUND OF THE INVENTION

This invention relates to detector circuits and in particular to dynamic sense-refresh detector amplifiers useful in dynamic random access memory (RAM) systems.

A basic detector for such use is essentially a flip-flop circuit in which current alternates from one leg to the other as a function of an input signal. Each leg contains an MOS load transistor in series with an MOS switching transistor. The gate of each switching transistor is cross coupled to the drain of the other switching transistor. A dc voltage supply is applied to the common drains of the load transistors and an input signal is coupled to one of the gates of the switching transistors. One of the major problems of this detector is that power dissipation is relatively high since there is essentially always dc current flow.

The use of the basic MOS detector flip-flop with a pulsed voltage power supply reduces power dissipation. Ideally power should be turned off just after the proper output state is achieved. One difficulty is that a reasonable time span must be provided after the output is supposed to have reached the correct level in order to insure that in fact the correct level is achieved. This is wasteful of power.

Alternatively detector circuits providing two sets of cross coupled MOS transistors have been utilized to automatically limit power dissipation by opening all dc paths at least by the time output signals reach the appropriate levels. One of the problems associated with this kind of detector is that the complexity and the dual cross coupling requires a considerable amount of silicon area for implementation thereof.

It would be desirable to have a sense-refresh detector amplifier which operates dynamically, has relatively low power dissipation, and requires a relatively modest amount of silicon area for implementation thereof.

SUMMARY OF THE INVENTION

An illustrative embodiment of the invention comprises a sense-refresh detector amplifier which comprises essentially first and second MOS transistors in which the respective gates are cross coupled to the drains (a cross coupled pair), voltage equalization circuitry, and two essentially identical load-refresh circuits which each comprise three MOS transistors and a capacitor. Typically, each capacitor is an MOS transistor with the gate serving as one terminal and the drain and source together serving as the other.

The drains of the cross coupled pair serve as input/output terminals. Each input/output terminal is coupled to a separate load-refresh circuit. The voltage equalization circuitry is coupled to both input/output terminals. The sources of the cross coupled pair are coupled together to the drains of two other transistors. The first of these transistors is used to selectively set the potential of the sources of the cross coupled pair to a preselected potential. The second transistor is used to facilitate selective conduction through one and/or the other of the transistors of the cross coupled pair.

The operation of the above amplifier is as follows: At the start of a cycle the voltage equalization circuitry is activated such that the two input/output terminals are essentially equalized in potential. Essentially concurrently the sources of the cross coupled pair are set in potential to a value which is essentially equal to that of the input/output terminals. The circuitry utilized to establish the initial conditions is now deactivated. Next, a 1 or a 0 input signal, typically the read out of a memory cell of a dynamic random access memory (RAM) is applied to one input/output terminal and a reference signal having a potential level midway between a 1 and 0 is applied to the other input/output terminal. This causes an imbalance in the potentials of the two input/output terminals. Next, a conduction path is established such that one of the transistors of the cross coupled pair can conduct and discharge the input/output terminal coupled thereto. The conduction through one of the transistors of the cross coupled pair further increases the differential potential between the two input/output terminals and thus effectively latches up the cross coupled pair. Next, a voltage pulse is applied to the capacitor of each load-refresh device. If the input/output terminal initially was charged to a 1 level then the load-refresh circuit coupled thereto is turned on and that input/output terminal is charged to a 1 potential level plus one threshold voltage and not just to within one threshold voltage of the 1 level. This insures that a full 1 level is written back into the memory cell during refresh. If the input signal is a 0, then the associated load-refresh circuit does not turn on and the 0 is maintained.

The load-refresh devices can be located essentially anywhere on the bit lines of a RAM and therefore considerable layout design flexibility exists. In addition, the silicon area necessary for the implementation of the sense-refresh detector amplifier is relatively small. This facilitates a reduction in the size of the RAMs which utilize the present invention. In addition, at the end of each cycle of operation of the sense-refresh detector amplifier no dc paths exist and during a cycle only transient conduction occurs. Accordingly, power dissipation is kept relatively low.

These and other features of the invention will be better understood from a consideration of the following detailed description taken in conjunction with the following drawings.

BRIEF DESCRIPTION OF THE DRAWINGS

FIG. 1 illustrates a sense-refresh detector amplifier in accordance with one embodiment of the invention and FIG. 2 graphically illustrates typical waveforms used with the sense-refresh detector amplifier of FIG. 1.

DETAILED DESCRIPTION

Referring now to FIG. 1 there is illustrated a dynamic sense-refresh amplifier 10 which comprises transistors Q1 through Q15. For illustrative purposes the transistors are all assumed to be n-channel MOS transistors. An MOS transistor will be described as enabled if the potential of the gate with respect to the source is of sufficient amplitude and polarity to allow conduction between the source and drain thereof. Conversely, a disabled MOS transistor is one in which the potential of the gate is insufficient or of the wrong polarity to allow conduction between the source and drain thereof.

The drains of Q3, Q4, Q6, Q8, Q9, Q12, and Q13 are all coupled to a power supply denoted as VDD (typically +12 volts). The source of Q7 is coupled to a power supply denoted as VSS (typically 0 volts). The gates of Q3, Q4, Q5, Q6, Q8, and Q13 are all coupled to a voltage pulse source denoted as PC. The gate of Q7 is coupled to a voltage pulse source denoted as S1. The gates of Q11 and Q14 and the drains and sources of Q10 and Q15 are all coupled to a voltage pulse source denoted as S2. The sources of Q3, Q9, and Q11, the drains of Q1 and Q5, and the gate of Q2 are all coupled to an input/output terminal A. A parasitic capacitor CA is illustrated coupled between the A input/output terminal and power supply VBB (typically −5 volts). The sources of Q4, Q5, and Q12, and the gate of Q1 are all coupled to the B input/output terminal. A parasitic capacitor CB is illustrated coupled between the B input/output terminal and VBB. The sources of Q1 and Q2, the source of Q6 and the drain of Q7 are coupled to node C. The source of Q8, the gates of Q9 and Q10, and the drain of Q11 are all coupled to node D. Q10 is connected so as to act as a capacitor. The gates of Q12 and Q15, the source of Q13, and the drain of Q14 are coupled to node E. Q15 is connected so as to act as a capacitor.

A memory cell, such as the memory cell contained within dashed line rectangle 12, is typically coupled to input/output terminal A and a reference cell, such as is illustrated within dashed line rectangle 14, is typically coupled to input/output terminal B. The memory cell contained within dashed line rectangle 12 is commonly denoted as a switched capacitor memory cell. It comprises transistor Q18 and capacitor CC. The gate of Q18 is typically coupled to a word line WL of an array of memory cells of a RAM (not illustrated). One terminal of CC is coupled to the source of Q18 and the other is coupled to VDD. The drain of Q18 is coupled to input/output terminal A. The reference cell contained within dashed line rectangle 14 comprises transistors Q16 and Q17 and capacitor CD. The drain of Q16 is illustrated coupled to input/output terminal B, and the gate is illustrated coupled to a reference word line WR of an array of a RAM (not illustrated). The sources of Q16 and Q17 and one terminal of CD are all coupled together. The second terminal of CD is coupled to VDD, and the gate of Q17 is coupled to PC. The drain of Q17 is coupled to a voltage pulse source VMR.

The cell shown within dashed line rectangle 12 and its mode of operation are well known. As Q18 is enabled the potential of input/output terminal A is effectively transferred to capacitor CC. A 1 stored in a memory cell results in the capacitor thereof being charged to a potential of about VDD minus one threshold voltage. A 0 stored in a memory cell results in the capacitor thereof being charged to a potential of about VSS. A 1 is written into memory cell 12 by enabling Q18 and applying a potential level of VDD plus one threshold potential to the drain of Q18 (input/output terminal A). The read out of logic information stored in memory cell 12 is accomplished by enabling Q18 and allowing the potential of the drain thereof (input/output terminal A) to change as a function of the stored logic information (the potential level of CC). The read out is destructive and accordingly the originally stored logic information must be refreshed (rewritten) or it is lost.

The reference cell contained within dashed line rectangle 14 contains essentially the same memory cell as shown with dashed line rectangle 12, however, the internal storage node between Q16 and CD is accessible through Q17 as well as Q16. Information is stored in the reference cell 14 as a function of the potential of CD. Typically CD is charged to a potential level which is midway in value between a 1 and a 0 by disabling Q16 and enabling Q17 and applying the appropriate potential to the drain of Q17 (VMR). Read out is accomplished by enabling Q16 and allowing the potential of the drain of Q16 (input/output terminal B) to change in potential as a function of the information stored in reference cell 14. The information stored in 14 is destroyed by the read operation and is restored by again enabling Q17 and applying the appropriate potential thereto. This middle value potential provides for balanced noise margin (i.e., the differential voltage established between a 1 signal applied to the A input/output terminal and the reference voltage applied to the B input/output terminal is essentially the same as that between a 0 signal applied to the A input/output terminal and the reference voltage applied to the B input/output terminal). CA and CB represent the parasitic capacitance of 10 plus that of all of the corresponding bit line of a RAM (not illustrated) and the memory cells coupled thereto. Typically CA and CB are much larger than CC and CD. Accordingly, when Q16 and Q18 are enabled, the differential change of potentials of input/output terminals A and B is typically just several hundred millivolts.

Circuit 10 operates as follows: Initially PC is held at 1 level and WL, WR, S1 and S2 are all held at the 0 level. The VMR terminal is held at a potential level between a 1 and 0. This enables Q3, Q4, Q5, Q6, Q8, and Q13. This condition charges node D to VDD minus the threshold voltage of Q8, charges node E to VDD minus the threshold voltage of Q13, and charges node C to VDD minus the threshold voltage of Q6. Typically Q3 and Q4 have essentially the same threshold voltage since they are selected to have the same geometry and are fabricated together on a single monolithic integrated circuit chip. Any differences in the threshold voltages of Q3 and Q4 can cause input/output terminals A and B to be set to different potential levels. Q5 serves to insure that input/output terminals A and B are set to essentially the same potential by directly connecting input/output terminals A and B when Q5 is enabled. In a preferred embodiment of the invention the geometry of Q5 is selected such that the threshold voltage of Q5 is less than that of Q3 and Q4. This insures that Q5 becomes enabled prior to Q3 and Q4 becoming enabled, and that even after terminals A and B reach the potentials of VDD minus the threshold voltage of Q3 and Q4, respectively, that Q5 remains enabled. Thus, even slight differences in the threshold voltages of Q3 and Q4 are effectively cancelled because Q5 insures that input/output terminals A and B are equalized in potential. Thus, when Q3, Q4, and Q5 are enabled input/output terminals A and B are set to a potential level of approximately VDD minus the threshold voltage of Q3 or Q4 (whichever is lower). Q5 thus increases the sensitivity of sense-refresh detector amplifier 10 by allowing input signals to be somewhat smaller in magnitude then would be tolerable if Q5 is not utilized. For many applications Q5 is unnecessary and may be eliminated.

Typical voltage waveforms for use with the circuitry of FIG. 1 are illustrated in FIG. 2. Initially, PC is held at VDD and WL, WR, S1, and S2 are all held at VSS. As previously indicated VDD is typically +12 volts and VSS is typically 0 volts. PC is then pulsed in potential to VSS. This leaves input/output terminals A and B and nodes C, D, and E floating in potential at approximately VDD minus one threshold voltage. As has been discussed earlier herein, the value of the threshold voltage is a function of the transistor(s) coupled to the appropriate input/output terminal or circuit node. With PC at VSS, the WL and WR potentials are pulsed from VSS to VDD. This enables Q16 and Q18 and thus causes input/output terminals A and B to be changed in potential in accordance with the information stored within memory cell 12 and reference cell 14, respectively.

Assuming the memory cell had stored a 1 (VDD minus one threshold voltage) and the reference cell stored a potential halfway between a 1 and a 0, input/output terminal A will remain at essentially VDD minus one threshold voltage and input/output terminal B will be discharged somewhat below VDD minus one threshold voltage. Thus, there is created a differential voltage between input/output terminals A and B.

S1 is now pulsed from VSS to VDD. This enables Q7 and thus discharges node C from VDD minus one threshold voltage towards VSS. As node C discharges to VDD minus two threshold levels, Q2 is enabled, and thus input/output terminal B starts to discharge in potential toward VSS. Q1 remains disabled and thus input/output terminal A remains at the VDD minus one threshold voltage level. At this point in time, Q12 is enabled and thus there is current flow from VDD through enabled Q12, Q2 and Q7 to VSS. The relative geometry of Q12 and Q2 are selected such that the beta of Q2 is significantly larger than that of Q12. This insures that input/output terminal B is approximately one threshold voltage above VSS. This condition maintains Q1 disabled and thus input/output terminal A remains floating in potential at VDD minus one threshold voltage.

After some delay (typically 15 nanoseconds) S2 is pulsed from VSS to VDD minus one threshold voltage. S2 is coupled to Q10, Q11 and Q14 and Q15. Q10 and Q15 both were enabled previously and thus act as capacitors at this point in time When the potential of the gate of Q14 reaches a level equal to the potential of input/output terminal B plus one threshold voltage, Q14 is enabled and the potential of the gate of Q12 (node E) begins to discharge towards the potential of the input/output terminal B. Q12 thus becomes disabled and input/output terminal B then completely discharges VSS. At the time S2 reaches the VDD minus one threshold voltage level the A input/output terminal is at a level of approximately VDD minus one threshold voltage. Q11, which had been disabled, remains disabled and node D is bootstrapped in potential to a potential level of at least VDD plus one threshold voltage. As the potential of node D increases to a level at least one threshold voltage above VDD, input/output terminal A (the source of Q9) charges from an initial potential of VDD minus one threshold voltage to a potential level of VDD. The final potentials of input/output terminals A and B are therefore VDD and VSS, respectively. This indicates the read out of a 1 from memory cell 12. The potential levels of the A and/or B input/output terminals are now sensed. Q18 is already enabled at this point in time and the drain thereof is at a potential of VDD. This refreshes (rewrites) memory cell 12 by charging CC to VDD minus one threshold voltage, a 1.

It is to be noted that at this point in time there are no dc paths between VDD and VSS. Accordingly, dc power dissipation is kept relatively low. In addition, noise margin is kept high since the memory cell is refreshed to VDD minus one threshold voltage because input/output terminal A is charged to VDD even though the information read out of the memory cell on to input/output terminal A was at the VDD minus one threshold voltage level.

Now PC, WL, WR, S1, and S2 are pulsed back to the initial levels and a new cycle of the sense-refresh detector amplifier 10 can be started.

If the information stored within memory cell 12 is a 0 instead of a 1, Q1 becomes enabled and input/output terminal A is discharged towards VSS. This enables Q11 and consequently discharges the gate of Q9 and thereby disables Q9. This allows input/output terminal A to discharge to VSS. Q18 is already enabled at this point in time and the drain thereof is at a potential of VSS. This refreshes memory cell 12 in that CC is resorted to the original potential level of VSS, a 0. Input/output terminal B is charged to VDD because Q12 remains enabled and mode E is charged to at least VDD plus one threshold voltage.

If memory cell 12 stores a 1 input/output terminal A is set to VDD. If a 0 is stored input/output terminal A is set to VSS. In either case the operation of 10 is such that all possible dc paths between VDD and VSS are opened at the beginning and end of a cycle. Essentially the only time a direct electrical path between VDD and VSS exists is during the time of the transient conduction through Q1 and/or Q2 and the load-refresh circuits coupled thereto.

Sixty-four of the above-described sense-refresh detector amplifiers 10 have been fabricated as part of a 4,096 bit dynamic n-channel RAM memory system that has been fabricated on a single silicon integrated circuit chip. Each sense-refresh amplifier was fabricated in approximately 26 square mils of semiconductor area. The VBB potential (typically −5 volts) is applied to the semiconductor substrate. The memory is divided into two 32 × 64 arrays of memory cells which are separated by the 64 cross coupled pairs of Q1 and Q2. The 64 load-refresh circuits comprising Q8, Q9, Q10 and Q11, are placed above the first array of memory cells and coupled to the bit lines thereof. The 64 load-refresh circuits comprising Q12, Q13, Q14, and Q15 are placed below the second array of memory cells and coupled to the bit lines thereof. The PC, S1, S2, WL, WR, and VMR voltage waveforms are provided by circuitry of the RAM. PC, which is generally denoted as a precharge voltage pulse, is utilized to set the potentials of circuitry of the RAM other than the sense-refresh detector amplifiers 10. The structure of the load-refresh circuits, and in particular the lack of direct cross coupling therebetween, facilitates the above-described layout of the RAM. This layout facilitated a reduction of the entire chip size.

The power dissipation of the sense-refresh detector amplifier of high capacity MOS memories presently represents a relatively large portion of the overall power dissipation. The dynamic operation of the present sense-refresh detector amplifier facilitates relatively low power dissipation for the entire RAM.

It is to be understood that the embodiments described are merely illustrative of the general principles of the invention. Various modifications are possible within the scope of the invention. For example, p-channel MOS transistors could be substituted for the n-channel MOS transistors provided the polarities of the power supply potentials and voltage pulses are appropriately changed.

What is claimed is:

1. A sense-refresh detector comprising:
   first and second switching devices, each device having a control terminal and first and second output terminals;
   first and second input/output terminals, the first output terminal of the first device and the control terminal of the second device being coupled to the first input/output terminal and the first output terminal of the second device and the control terminal of the first device being coupled to the second input/output terminal,
   voltage equalization circuit means coupled to both input/output terminals for periodically essentially equalizing the potentials of both input/output terminals;
   first and second essentially identical load-refresh circuits, each load-refresh circuit comprising a capacitor circuit means having first and second terminals and third, fourth, and fifth switching devices each having a control terminal and first and second output terminals;
   the control terminal of the third device of each load-refresh circuit being coupled to the first output terminal of the fourth device, the second output terminal of the fifth device, and the second terminal of the capacitor circuit means;
   the second output terminals of the third and fourth devices being coupled together and being coupled to one input/output terminal;
   voltage setting circuit means being coupled to the second output terminals of the first and second devices for periodically setting the potential of said terminals to a preselected potential; and
   conductive enabling circuit means being coupled to the second output terminals of the first and second switching devices for periodically facilitating conduction through the first and/or second switching device.

2. The apparatus of claim 1 wherein the first output terminals of the third and fifth devices of each load-refresh circuit are coupled together and the control terminal of the fourth device and the first terminal of the capacitor circuit means are coupled together.

3. The apparatus of claim 2 wherein:
   the voltage equalization circuit means comprises sixth, seventh, and eighth switching devices which each have a control terminal and first and second output terminals;
   the control terminals of the sixth, seventh, and eighth devices being coupled together and the first output terminals of the sixth and seventh devices being coupled together;
   the second output terminal of the sixth device being coupled to the first input/output terminal and to the first output terminal of the eighth device; and
   the second output terminal of the seventh device being coupled to the second input/output terminal and to the second output terminal of the eighth device.

4. The apparatus of claim 3 wherein all of the switching devices are MOS transistors.

5. The apparatus of claim 4 wherein the capacitor of each load-refresh circuit is an MOS transistor in which the gate serves as the second terminal and the source and drain are coupled together and serve as the first terminal.

* * * * *